United States Patent [19]

Yamada

[11] Patent Number: 5,313,062
[45] Date of Patent: May 17, 1994

[54] AUTOMATIC FOCUSING AND ASTIGMATISM CORRECTION FOR ELECTRON BEAM APPARATUS

[75] Inventor: Atsushi Yamada, Tokyo, Japan
[73] Assignee: JEOL Ltd., Tokyo, Japan
[21] Appl. No.: 16,749
[22] Filed: Feb. 11, 1993
[30] Foreign Application Priority Data
  Feb. 19, 1992 [JP] Japan .................. 4-031980
[51] Int. Cl.$^5$ ............................ H01J 37/21
[52] U.S. Cl. ................... 250/310; 250/307; 250/396 R; 250/396 ML; 250/397
[58] Field of Search ........... 250/310, 311, 396 R, 250/307, 396 ML, 397

[56] References Cited

U.S. PATENT DOCUMENTS 4,199,681  4/1980  Namae ..................... 250/311
5,130,450  7/1992  Yamada et al. ........... 250/310

Primary Examiner—Paul M. Dzierzynski
Assistant Examiner—Kiet T. Nguyen
Attorney, Agent, or Firm—Webb, Burden, Ziesenheim & Webb

[57] ABSTRACT

A method of automatically and accurately accomplishing focusing and astigmatism correction in an electron beam apparatus such as a scanning electron microscope. The electron beam is raster scanned to scan a specimen in two dimensions. If the obtained signal intensity distribution curve has only one peak, the peak position P2 of a curve obtained by raster scanning the beam vertically is detected. The peak position P1 of a curve obtained by raster scanning the beam horizontally is detected. An intermediate position P0 is calculated, using the formula $$P0 = (P1 + P2)/2$$

The intensity of excitation of the objective lens is adjusted to this intermediate position P0. In this way, if two peaks cannot be obtained by a horizontal raster scan of the beam, depending on the state of the surface of the specimen, it is possible to accurately bring the beam into focus at the position of the circle of least confusion. After this focusing operation, an automatic astigmatism correction is made.

5 Claims, 5 Drawing Sheets

AUTOMATIC FOCUSING AND ASTIGMATISM CORRECTION FOR ELECTRON BEAM APPARATUS

FIELD OF THE INVENTION

The present invention relates to an electron beam apparatus such as a scanning electron microscope and, more particularly, to automated focusing and astigmatism correction used in an electron beam apparatus.

BACKGROUND OF THE INVENTION

Where an electron beam apparatus such as a scanning electron microscope automatically effects both focusing and astigmatism correction, an automatic focusing operation is first performed. In this focusing operation, the focus is brought into the position of the circle of least confusion. Then, an astigmatism correction is made. To bring the focus into the position of the circle of least confusion, an electrical current supplied to the objective lens or to a lens auxiliary to the objective lens is varied in a stepwise fashion. The position of the focus is shifted for each different value of the lens current so that the electron beam scans the surface of a specimen in two dimensions. During the two-dimensional scan, secondary electrons or reflected electrons emanating from the specimen are detected by a detector. The output signal from the detector is integrated for one frame of image. The signal distribution curve shown in FIG. 1 is obtained from the integrated values derived from every value of lens current. The integrated values are plotted on the vertical axis of FIG. 1. The intensity of excitation of the objective lens is plotted on the horizontal axis. It is known that the position of the peak of this distribution curve is the position of the circle of least confusion. The objective lens current is so controlled that the intensity of excitation of the lens corresponds to the position of the peak. Then, an automatic astigmatism correction is made. Subsequently, a second automatic focusing operation is performed. FIG. 2 is a flowchart illustrating these focusing operations and astigmatism correction operations.

Where the electron beam involves astigmatism, the above-described signal distribution curve has two peaks as shown in FIG. 3. In this case, it is known that the position of least confusion lies midway between the two peaks P1 and P2. If the difference in height between the two peaks is great, then there is the possibility that the control system erroneously regards the maximum peak position P1 as the position of least confusion. At this time, if the focus is brought to an overlying position that is not the position of least confusion, and if an astigmatism correction is made at that position, then the correction is not carried out accurately.

SUMMARY OF THE INVENTION

It is an object of the present invention to provide a method of automatically performing both focusing operation and astigmatism correction accurately in an electron beam apparatus.

This object is achieved in an electron beam apparatus having an objective lens, a condenser lens for sharply focusing an electron beam directed to the surface of a specimen, deflecting means for scanning the electron beam in two dimensions in the x- and y-directions, and an astigmatic corrector disposed in the electron beam path. The inventive method comprises the steps of: scanning the electron beam horizontally on the specimen and shifting the scanning line vertically to scan the specimen in two dimensions; detecting electrons produced from the specimen by a detector and integrating the output signal from the detector by an integrator; repeating the scan of the electron beam many times with different intensities of excitation of the objective lens; finding a curve representing variations in the output signal from the integrator caused by variations in the intensity of excitation of the objective lens. If the curve has two peaks, the intensity of excitation of the objective lens is adjusted to a position midway between the two peaks of the curve, and then an astigmatism correction is made. If only one peak is found in the curve, the electron beam is raster scanned on the specimen vertically to scan the specimen in two dimensions. Electrons produced from the specimen in response to the two-dimensional scan are detected by the detector. The scan is repeated many times with different intensities of excitation of the objective lens. A curve representing variations in the output signal from the integrator caused by variations in the intensity of excitation of the objective lens is found. The intensity of excitation of the objective lens is adjusted to a position midway between the peak of this curve and the peak of the curve already obtained by the first twodimensional scan of the beam, and then an astigmatic correction is made.

Other objects and features of the invention will appear in the course of the description thereof which follows.

DETAILED DESCRIPTION OF THE INVENTION

Figure 1:
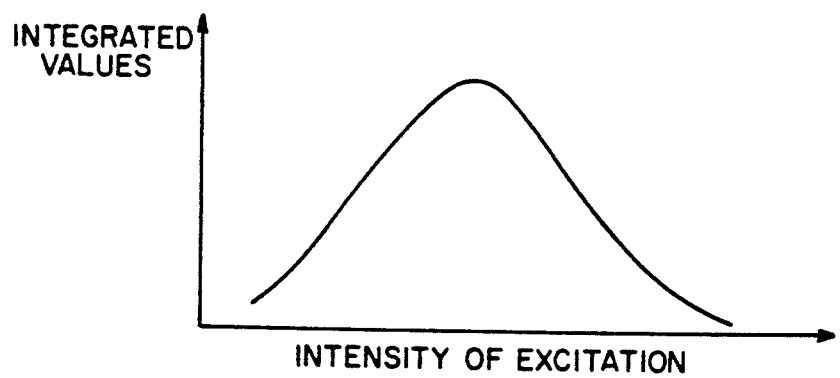
FIG. 1 is a graph showing the relation of the integrated value of the output signal from a secondary electron detector used in a conventional electron beam apparatus to the objective lens current varied in a stepwise fashion.
Figure 2:
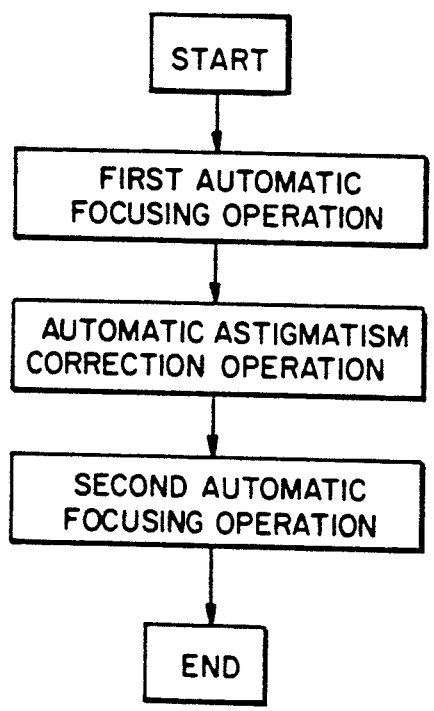
FIG. 2 is a flowchart illustrating focusing operations and an astigmatism correction operation performed in the conventional electron beam apparatus.
Figure 3:
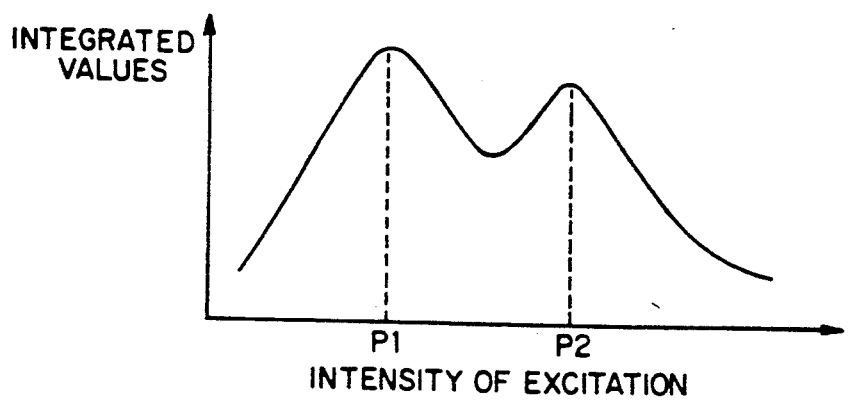
FIG. 3 is a graph similar to FIG. 1, but in which the electron beam involves astigmatism.
Figure 4:
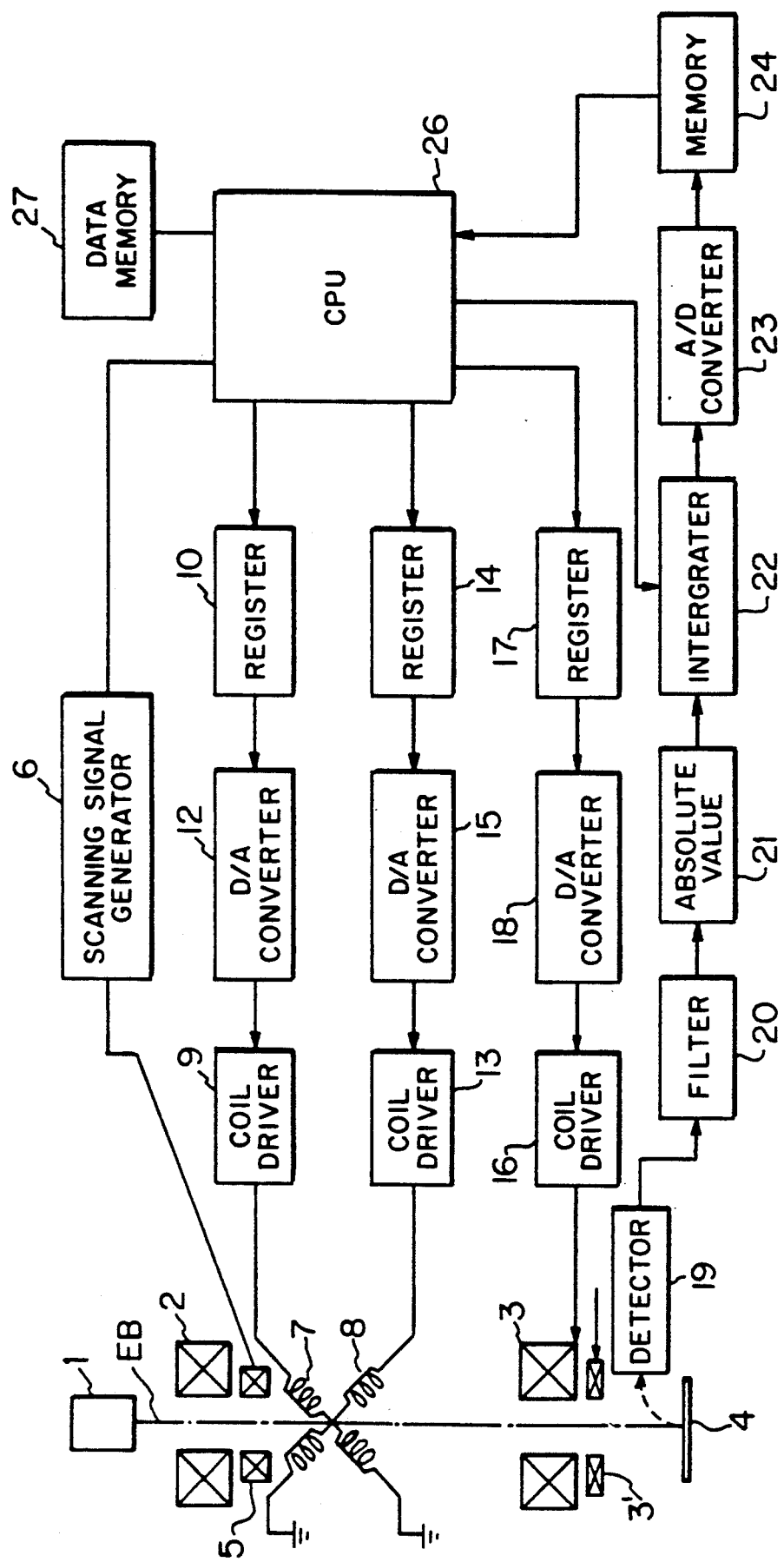
FIG. 4 is a block diagram of a scanning electron microscope for carrying out a method according to the invention.

Referring to FIG. 4, there is shown a scanning electron microscope for carrying out a method of correcting astigmatism in accordance with the present invention. The microscope has an electron gun 1 emitting an electron beam EB which is focused onto a specimen 4 by a condenser lens 2 and an objective lens 3. Beam-deflection coils 5 scan the electron beam EB on the specimen 4 according to scanning signals produced by a scanning signal-generating circuit 6. Coils 7 and 8 are provided to correct astigmatism in the x- and y-directions, respectively. The x-direction astigmatism correction coil 7 is excited by a coil driver portion 9, which is supplied with data used to correct astigmatism in the x-direction from a register 10 via a D/A converter 12. The y-direction astigmatism correction coil 8 is excited by a coil driver portion 13, which is supplied with data used to correct astigmatism in the y-direction from a register 14 via a D/A converter 15. The objective lens 3 is excited by a driver portion 16, which is supplied with data about objective lens current values from a register 17 via a D/A converter 18. A detector 19 detects secondary electrons produced by the irradiation of the electron beam to the specimen 4. The output signal from the detector 19 is supplied to an integrator 22 via a filter circuit 20 and via an absolute-value circuit 21. The integrated value obtained by the integrator 22 is supplied via an A/D converter 23 to a memory 24, where the value is stored. A CPU 26 creates a signal intensity distribution from the signal stored in the memory 24, and detects peak values. The CPU 26 controls the scanning signal-generating circuit 6, the integrator 22, and other components. The CPU 26 also acts to read values from a data memory 27, to place data used to correct astigmatism into the registers 10 and 14, and to place data about objective lens current values into the register 17.

Figure 5:
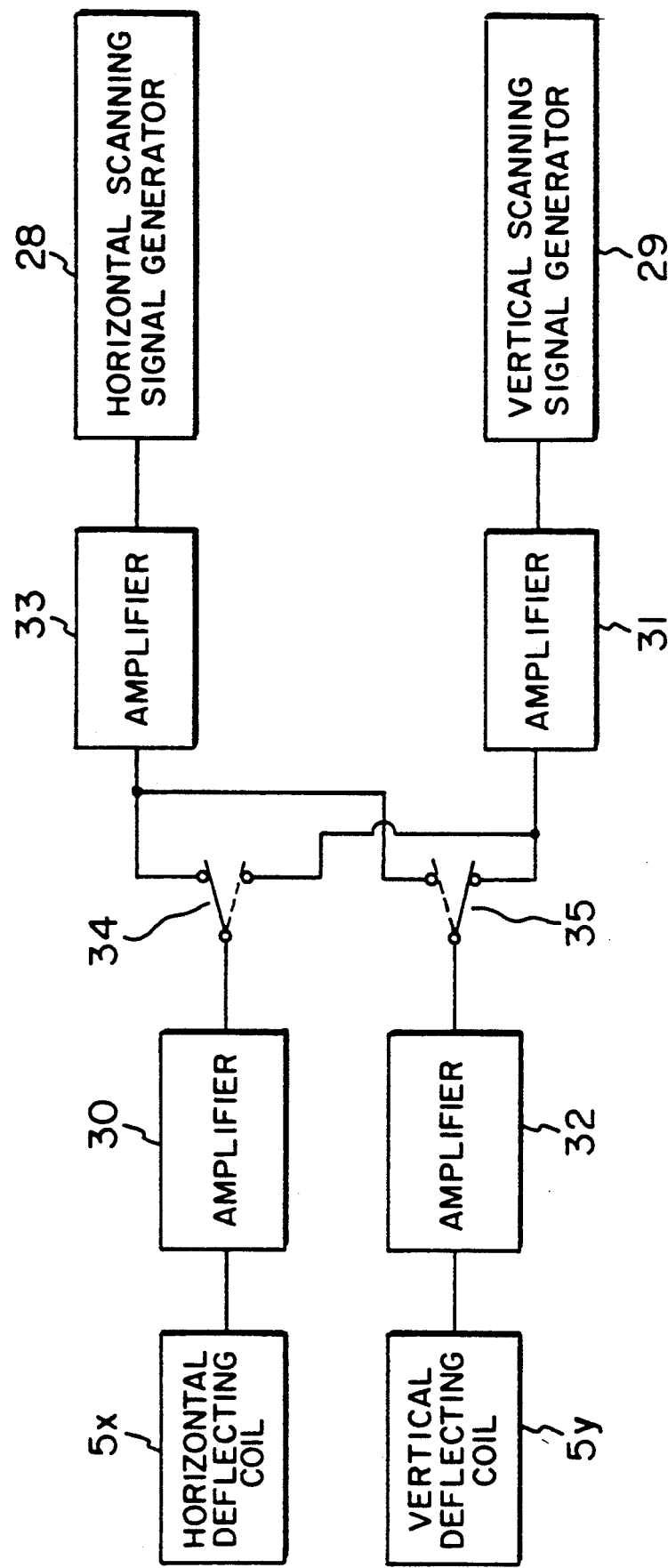
FIG. 5 is a block diagram of the scanning signal-generating circuit shown in FIG. 4.

FIG. 5 particularly shows the beam-deflecting coils 5 and the scanning signal-generating circuit 6 shown in FIG. 4. One of the coils 5 is a horizontal deflecting coil 5x, while the other is a vertical deflecting coil 5y. The scanning signal-generating circuit 6 comprises a horizontal scanning signalgenerating circuit 28, a vertical scanning signalgenerating circuit 29, amplifiers 30, 31, 32, 33, and switches 34, 35. The switch 34 selectively supplies the horizontal and vertical scanning signals to the deflecting coil 5x. The switch 35 selectively supplies the horizontal and vertical scanning signals to the deflecting coil 5y.

The operation of the structure shown in FIGS. 4 and 5 is now described. When an ordinary secondary electron image of the specimen 4 should be obtained, the electron beam EB is sharply focused onto the specimen 4 by the condenser lens 2 and the objective lens 3. The scanning signal-generating circuit 6 supplies signals to the beam-deflecting coils 5 to scan the electron beam in two dimensions. The output signal from the secondary electron detector 19 is supplied to a cathode-ray tube (not shown). Normally, the switches shown in FIG. 5 are connected as indicated by the solid lines. The horizontal scanning signal from the horizontal scanning signal-generating circuit 28 is supplied to the horizontal deflecting coil 5x, whereas the vertical scanning signal from the vertical scanning signalgenerating circuit 29 is furnished to the vertical deflecting coil 5y. The specimen 4 is raster scanned horizontally by the electron beam. The raster line is shifted vertically successively.

An operation for focusing the electron beam is next described. The intensity of excitation of the objective lens 3 is varied in small increments. A desired region on the specimen 4 is scanned by the electron beam at each different value of the intensity of excitation. In this case, the objective lens current placed into the register 17 from the CPU 26 is varied in small increments. The CPU 26 controls the scanning signal-generating circuit 6 in such a way that one twodimensional scan is made for each different objective lens current.

Figure 6:
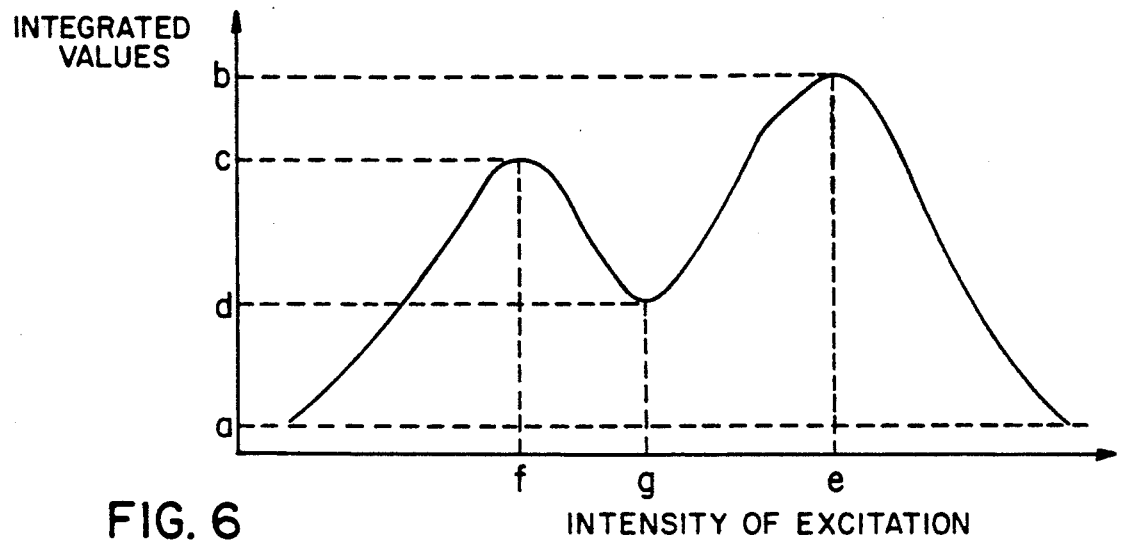
FIG. 6 is a graph showing the relation of the integrated value of the output signal from a secondary electron detector used in the scanning electron microscope shown in FIG. 4 to the objective lens current varied in a stepwise fashion.

The secondary electrons produced in response to the irradiation of the electron beam EB to the specimen 4 are detected by the detector 19. The output signal from the detector 19 is fed to the integrator 22 via the filter circuit 20 and via the absolute-value circuit 21. The integrator 22 integrates its input signal during each two-dimensional scan of the beam. After each two-dimensional scan, the value obtained by the integrator 22 is supplied to the memory 24, where the value is stored together with the corresponding intensity of excitation of the objective lens 3. Where the electron beam is scanned in two dimensions and the output signal from the secondary electron detector is integrated for each different value of the intensity of excitation of the objective lens 3, if astigmatism is present, the CPU 26 creates a signal intensity distribution curve as shown in FIG. 6. In FIG. 6, the intensity of excitation of the objective lens is plotted on the horizontal axis, and the integrated value is plotted on the vertical axis.

If the CPU 26 detects two peaks in the found signal intensity distribution curve, the CPU finds the intensity of excitation of the objective lens at the position midway between the two peaks. The CPU 26 places the value corresponding to this intensity of excitation into the register 17. Therefore, the intensity of excitation of the objective lens 3 is such that the circle of least confusion for the electron beam is formed on the specimen. Thus, the first focusing operation is finished. Thereafter, a well-known automatic astigmatism correction is made. In particular, a plurality of values which are used to correct the astigmatism and are to be supplied to the x-direction astigmatism correction coil 7 are read from the data memory 27 and supplied to the register 10. The electron beam is scanned for each different one of these correcting values. Secondary electrons produced during each scan are detected. The output signal from the detector corresponding to each correcting value is integrated. As a result, a curve is obtained from the correcting values. The astigmatism-correcting value which gives the peak of the curve is placed into the register 10. As a result, the astigmatism is corrected in the x-direction. Similarly, a plurality of values which are used for correcting the astigmatism and are to be supplied to the y-direction astigmatism correction coil 8 are read from the data memory 27 and supplied to the register 14. The electron beam is scanned for each different correcting value. Secondary electrons produced by each scan are detected. The output signal from the detector corresponding to each correcting value is integrated. As a result, a curve is derived from the output values from the integrator which correspond to the various correcting values. The correcting value which gives the peak of this curve is placed into the register 14. In this way, the astigmatism is corrected in the y-direction.

A method of discriminating between peak and noise when a peak is detected from the integral curve (shown in FIG. 6) obtained from the secondary electron detector for each value of the intensity of excitation of the objective lens is now described. In FIG. 6, a indicates the minimum value of the curve. Indicated by b is the maximum value. Indicated by c is the second greatest value. Indicated by d is the minimum value between a and c. Indicated by e is the intensity of excitation when the maximum value b is obtained. Indicated by f is the intensity of excitation when the second greatest value c is obtained. Indicated by g is the intensity of excitation when the minimum value between a and c is obtained.

In the case of FIG. 6, two peaks are discriminated from noise if all of the following three conditions are met:

(1) signal intensities:

a<b>d<c>a (2) the number of samples:

e−g≧two points f−g≧two points (3) relations among signal intensities:

(c−d)/(b−d)>R if (b−d)>(c−d)

(b−d)/(c−d)>R if (b−d)<(c−d)

where R is a threshold value. For example, R is selected equal to 0.6.

If these three conditions are satisfied, the position of the circle of least confusion is found from (e+f)/2.

Figure 7A:
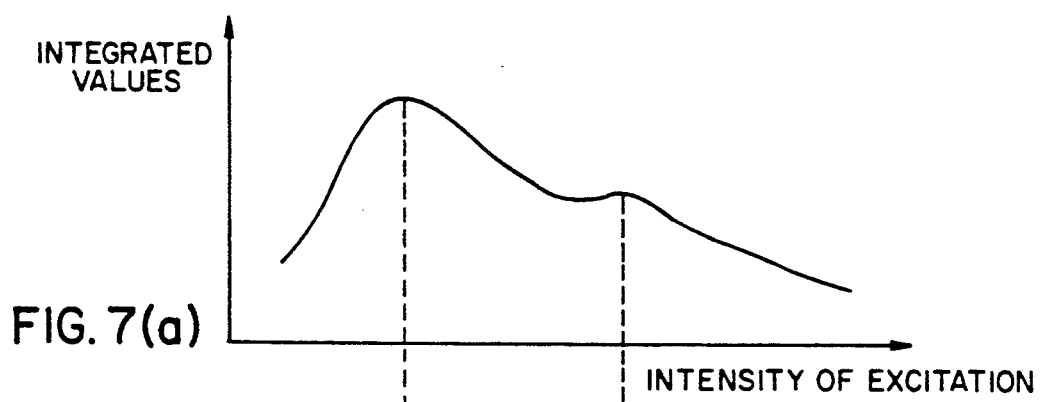
FIG. 7(a) and FIG. 7(b), are graphs showing the relation of the integrated values of the output signals from the detector of the scanning electron microscope shown in FIG. 4 to the objective lens current, the integrated values being obtained by two two-dimensional scans.
Figure 7B:
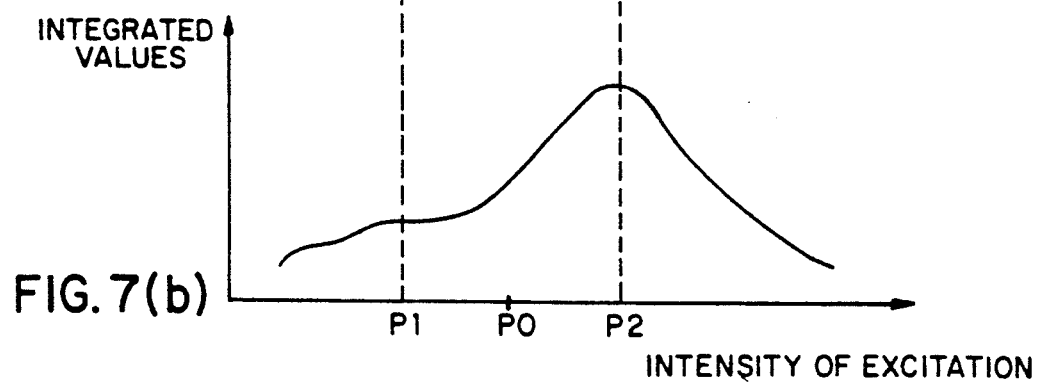

If any one of the above-described conditions is not catered for, or if the signal intensity distribution curve has only one peak, then the position of the circle of least confusion is detected in the manner described below. FIG. 7(a) shows the signal intensity distribution curve obtained from the integrator when the scanning signals from the horizontal scanning signal-generating circuit 28 and from the vertical scanning signalgenerating circuit 29 of the scanning signal-generating circuit 6 shown in FIG. 5 are supplied to the horizontal deflecting coil 5x and the vertical deflecting coil 5y, respectively. If the CPU 26 finds one peak (P1) from the distribution curve, the CPU switches the states of the switches 34 and 35 to the states indicated by the broken lines. Under this condition, the horizontal scanning signal and the vertical scanning signal are supplied to the vertical deflection coil 5y and the horizontal deflection coil 5x, respectively. As a result, the electron beam is raster scanned vertically on the specimen. The raster line is shifted horizontally. Whenever such a two-dimensional scan is made, the output signal from the detector is integrated by the integrator 22. At the same time, the intensity of excitation of the objective lens 3 is changed in a stepwise fashion. Consequently, the CPU 26 creates the signal intensity distribution curve shown in FIG. 7(b). Then, the CPU 26 finds from the distribution curve of FIG. 7(b) the peak position P2 at which the maximum value is obtained. The CPU 26 calculates P0=(P1+P2)/2, where P1 is the peak position P1 when the raster line is shifted horizontally, and P2 is the peak position wherein the raster line is shifted vertically. The intensity of excitation of the objective lens 3 which corresponds to P0 is found. In this way, if two peaks are not obtained in spite of two-dimensional scan of the electron beam according to the state of the surface of the specimen, the electron beam can be brought into focus at the position of the circle of least confusion. After this focusing operation, automatic astigmatic correction similar to the above-described correction is made.

Figure 8:
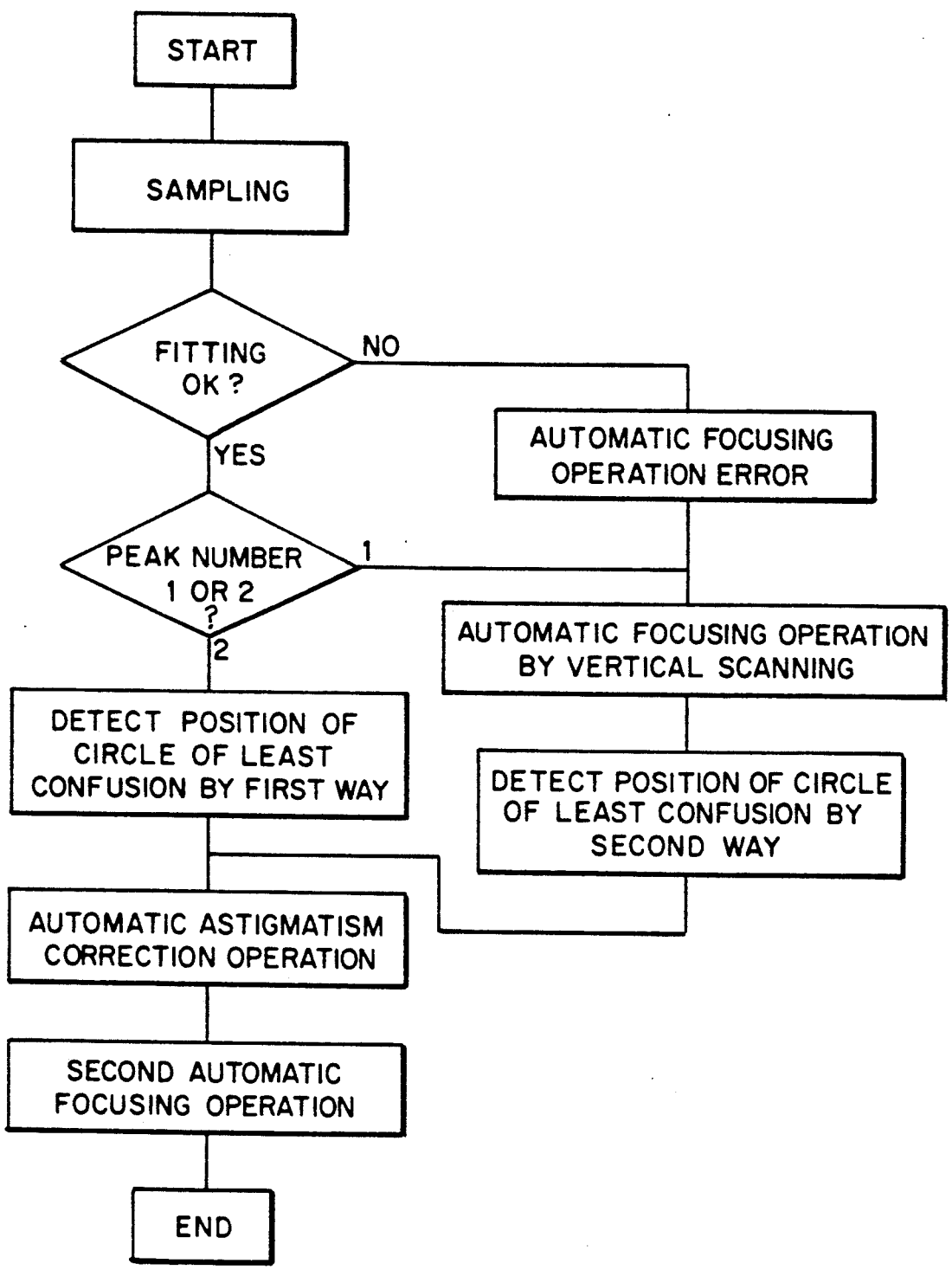
FIG. 8 is a flowchart illustrating focusing operations and astigmatism correction operations performed in accordance with the invention.

FIG. 8 is a flowchart illustrating the automatic focusing and the automatic astigmatism correction operations described above. Since the second automatic focusing operation is performed after an astigmatic correction, the specimen may be scanned in two dimensions while the beam is being raster scanned either horizontally or vertically.

While one embodiment of the invention has been described in detail, it is to be understood that the invention is not limited thereto. In the above embodiment, secondary electrons are detected. It is also possible to detect reflected electrons. Also in the above embodiment, the intensity of excitation of the objective lens is varied during the automatic focusing operation. Alternatively, the intensity of excitation of a lens auxiliary (see 3 in FIG. 4) to the objective lens could be varied.

As described above, the novel method of automatically achieving focusing and astigmatism correction in an electron beam apparatus involves scanning an electron beam horizontally on the surface of a specimen, moving the scanning line vertically to scan the specimen in two dimensions, and varying the intensity of excitation of the objective lens in a stepwise manner. The output signal from a secondary electron detector is integrated by an integrator. Variations in the intensity of the objective lens produce variations in the curve obtained by the integrator. If only one peak is found in the curve, the beam is scanned on the specimen vertically. The scanning line is shifted horizontally and thus the specimen is scanned in two dimensions The resulting signal is integrated. This scan of the electron beam is repeated many times while varying the intensity of excitation of the objective lens. A curve representing variations in the output signal from the integrator which are caused by the variations in the intensity of excitation of the objective lens is found. The objective lens is adjusted to the intensity of excitation lying midway between the peak of this curve and the peak of the curve already obtained by the first scan. Then, the astigmatism is corrected. Consequently, focusing and astigmatism correction can be automatically and accurately accomplished.

Having thus described my invention with the detail and particularity required by the Patent Laws, what is desired and claimed to be protected by Letters Patent is set forth in the following claims.

What is claimed is:

1. A method of automatically accomplishing focusing and astigmatism correction in an electron beam apparatus having an objective lens, a condenser leans for sharply focusing an electron beam directed to a surface of a specimen, deflecting means for scanning the electron beam in two dimensions in the x- and y-directions, and an astigmatism corrector disposed in the electron beam path, said method comprising the steps of:

scanning the electron beam horizontally on the specimen and shifting the scanning line vertically to scan the specimen in the two dimensions;

detecting electrons produced from the specimen by a detector and integrating an output signal from the detector by an integrator;

repeating the scan of the electron beam with different intensities of excitation of the objective lens; and finding a curve representing variations in an output signal form the integrator caused by variations in the intensity of excitation of the objective lens;

wherein if the curve has two peaks, the intensity of excitation of the objective lens is adjusted to a positions midway between the two peaks, and then an astigmatism correction is made;

and wherein if only one peak is found in the curve, the electron beam is scanned vertically, the vertical scanning line is shifted horizontally to scan the specimen in the two dimensions, the electrons produced from the specimen in response to the scan are detected by the detector, the output signal from the detector is integrated, the scan is repeated with different intensities of excitation of the objective lens, a curve representing variations in the output signal from the integrator caused by variations in the intensity of excitation of the objective lens is found, the intensity of excitation of the objective lens is adjusted to a position midway between the peak of this curve and the peak of the curve already obtained by the previous tow-dimensional scan of the beam, and then an astigmatism correction is made.

2. The method of claim 1, wherein said electron beam apparatus is a scanning electron microscope.

3. The method of claim 1, wherein the detected electrons are electrons reflected from the specimen.

4. The method of claim 1, wherein the detected electrons are secondary electrons.

5. The method of claim 1, wherein the electrons beam apparatus has a lens auxiliary to the objective lens, and wherein the intensity of excitation of the auxiliary lens is varied instead of the intensity of excitation of the objective lens.

* * * * *

UNITED STATES PATENT AND TRADEMARK OFFICE
CERTIFICATE OF CORRECTION

PATENT NO. : 5,313,062
DATED : May 17, 1994
INVENTOR(S) : Atsushi Yamada

It is certified that error appears in the above-indentified patent and that said Letters Patent is hereby corrected as shown below:

Title page, item [56], under References Cited, U.S. PATENT DOCUMENTS, "5,130,450 7/1992 Yamada et al. ... 250/310" should read --5,130,540 7/1992 Yamada et al. ... 250/310--.

Column 2 Line 25 "twodimensional" should read --two-dimensional--.

Column 3 Line 38 "signalgenerating" should read --signal-generating--.

Column 3 Line 39 "signalgenerating" should read --signal-generating--.

Column 3 Line 59 "signalgenerating" should read --signal-generating--.

Column 4 Line 3 "twodimensional" should read --two-dimensional--.

Column 5 Line 33 "signalgenerating" should read --signal-generating--.

Column 6 Line 13 "3" should read --3'--.

Claim 1 Line 48 Column 6 "leans" should read --lens--.

UNITED STATES PATENT AND TRADEMARK OFFICE
CERTIFICATE OF CORRECTION

PATENT NO. : 5,313,062
DATED : May 17, 1994
INVENTOR(S) : Atsushi Yamada

It is certified that error appears in the above-indentified patent and that said Letters Patent is hereby corrected as shown below:

Claim 1 Line 63 Column 6 "form" should read --from--.

Claim 1 Line 67 Column 6 "positions" should read --position--.

Claim 1 Line 15 Column 7 "tow" should read --two--.

Claim 5 Line 10 Column 8 "electrons" should read --electron--.

Signed and Sealed this

Twenty-third Day of August, 1994

Attest:

BRUCE LEHMAN

*Attesting Officer*        *Commissioner of Patents and Trademarks*